United States Patent [19]

Jasperson

[11] Patent Number: 4,533,240
[45] Date of Patent: Aug. 6, 1985

[54] FILM TO PANEL REGISTRATION DEVICE

[75] Inventor: Carl R. Jasperson, Anaheim, Calif.

[73] Assignees: Lowell A. Rodgers; Vernon C. Rodgers, both of Anaheim, Calif.

[21] Appl. No.: 404,517

[22] Filed: Jul. 30, 1982

[51] Int. Cl.³ .............................................. G03B 27/28
[52] U.S. Cl. ..................................... 355/125; 355/32; 355/128
[58] Field of Search ........................ 355/32, 125, 128; 24/623, 619, 614, 604

[56] References Cited

U.S. PATENT DOCUMENTS 3,170,368  2/1965  Barnhart ............................... 355/32
3,877,808  4/1975  Jasperson, Jr. ..................... 355/128

FOREIGN PATENT DOCUMENTS 268500  10/1963  Australia ............................ 24/623
37301   of 1873  United Kingdom ................. 24/623

Primary Examiner—Richard A. Wintercorn
Attorney, Agent, or Firm—G. Donald Weber, Jr.

[57] ABSTRACT

A device for maintaining films and panels in close tolerance registration. The device includes an upper leaf and a lower leaf which are selectively joined together by zero-tolerance snap connectors. The upper leaf and lower leaf are adapted to improve device wear characteristics and, as well, to improve the operation of the system which uses the registration device of the instant invention.

9 Claims, 15 Drawing Figures

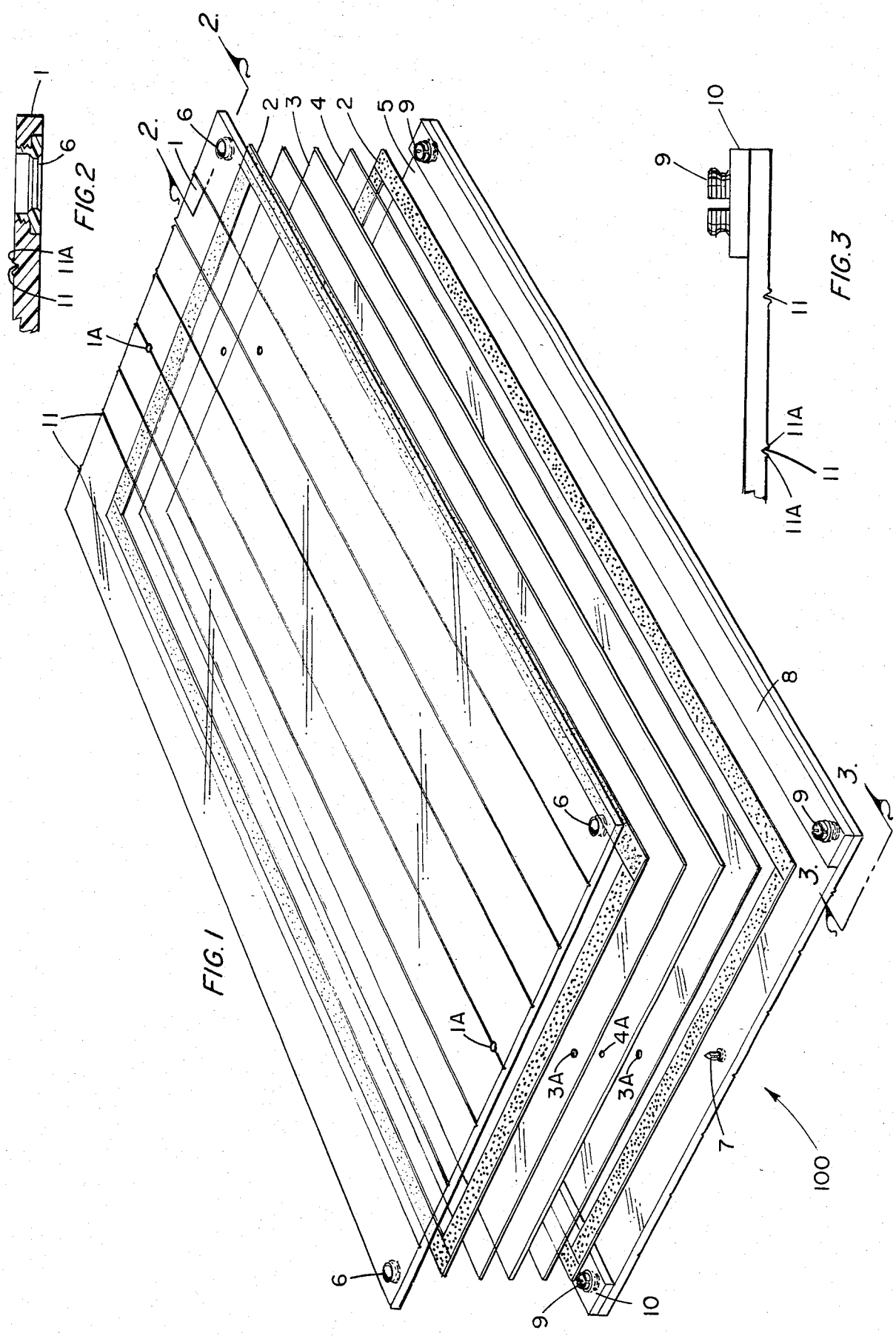

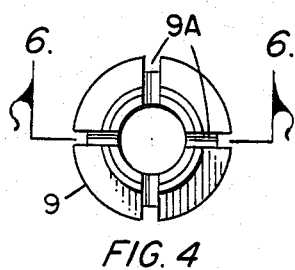
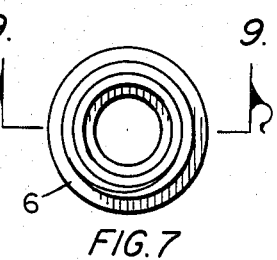
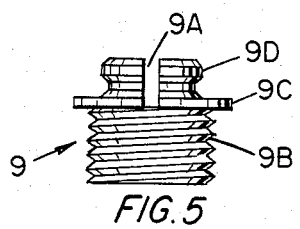
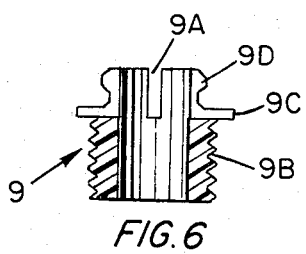
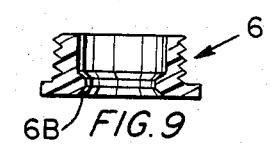
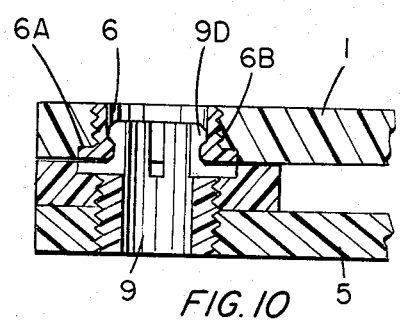
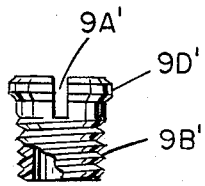
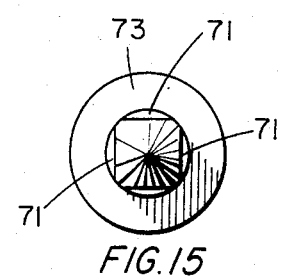
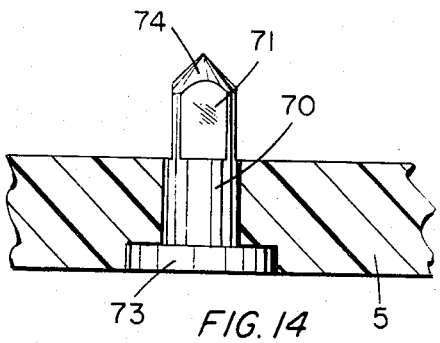
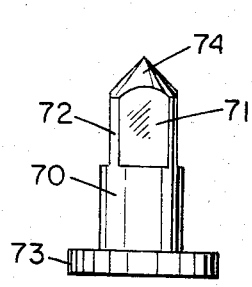
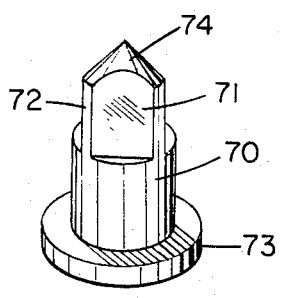

FILM TO PANEL REGISTRATION DEVICE

BACKGROUND

1. Field of the Invention

This invention is directed to devices which are used in the graphics industry, in general, and to high-accuracy, close-tolerance, lithographic techniques used in printed circuit board graphics, in particular.

2. Prior Art

In many industries, notably the electronic industry, there are developing more and more requirements for smaller and smaller devices. These smaller devices create greater density on the board or chip. As the density of devices, i.e., circuits, on the printed circuit board (for example) increases, the tolerance limits tend to decrease. Thus, techniques which were satisfactory for manufacturing processes ten years ago are no longer adequate for the manufacturing processes of today. This trend will, of course, continue. Nevertheless, in order to keep pace with this improving technology, the lithographic technology must also follow.

To this end, techniques have been developed using ion milling, ion etching, photosensitive materials and the like. Nevertheless, most of the known techniques require a suitable mask or image which is developed at a very large scale and reduced to form the image or mask for the actual production devices. The mask or image is then used with the actual device onto which the circuit, for example, is to be manufactured. These techniques include the well-known photosensitive techniques such as coating a circuit board with a polymer type material such as KPR or the like, exposing those materials to an appropriate light source through the imaging mask, and removing the undesirable material. This can be performed by producing a direct image, or a negative image, as the case may be. Of course, this operation is a function of the type of material which is used and the light source which is applied to sensitive portions of the masking material. When the undesired materials are removed, suitable plating, etching or similar type operations can be carried out. The etching can be a chemical etch, a laser etch or the like.

However, with the technology currently available, the technique of applying the mask or imaging material is extremely tedious and time consuming, as well as being subject to considerable human error problems. Despite the fact that many machines are now used which are vastly superior to earlier techniques, the shortcomings noted above still exist. Consequently, new and better registration devices are necessary.

PRIOR ART

The most pertinent reference known to Applicant is U.S. Pat. No. 3,877,808; entitled PRINTED CIRCUIT BOARD EXPOSURE HOLDING DEVICE, by Carl R. Jasperson. This patent relates to a holding device having a pair of leaves held together by a hinge means.

SUMMARY OF THE INSTANT INVENTION

This invention provides a registration device which includes a pair of leaf elements arranged to receive the transfer devices, including the ultimate circuit panel device, which leaves are held together by zero tolerance snaps. Registration pins are provided as well. The leaves are each arranged to enhance the air evacuation parameters of most operating machines.

BRIEF DESCRIPTION OF THE DRAWINGS

FIG. 1 is a perspective view of the registration device of the instant invention together with the articles to be registered.

FIG. 2 is a sectional view of a portion of a leaf, including a snap, of the instant invention, taken along the lines 2—2 in FIG. 1.

FIG. 3 is an end view of a portion of another leaf, including a snap of the instant invention, taken along the lines 3—3 in FIG. 1.

FIGS. 4 through 11 are detailed illustrations of the snap portions of the instant invention.

FIGS. 12 through 15 are detailed illustrations of the registration pins of the instant invention.

DESCRIPTION OF A PREFERRED EMBODIMENT

Referring now to FIG. 1, there is shown a generally perspective, exploded view of the registration device 100 of the instant invention together with representative elements which are to be registered. Typically, the elements which are to be registered do not form a part of the invention, per se. In the illustrative embodiment, the registered elements are arranged for a double-sided-board arrangement. That is, the circuit board or panel 4 can be considered to be any suitable type of double-clad fiberglass circuit panel (or board), or the like. The type of material and the fact of double or single-clad is not pertinent to the invention, per se. However, in typical fashion, the circuit board panel 4 will include a layer of copper on at least one surface thereof. In the embodiment shown, the double-clad circuit board is illustrated. On either side of the circuit panel 4 is disclosed a film 3 on which is produced the desired image for the circuit pattern to be produced in the copper surface of panel 4. The film 3 is, typically, transparent except for the location of the circuit lines. Of course, for different types of operations, the film can be a negative image rather than a positive image. In addition, on either side of circuit panel 4 and on the other sides of the image films 3, there are disposed adhesive layers 2. These adhesive layers can be of the transfer type which are used with the system. This adhesive may be of the type which remains tacky or some other type of device which will be described hereinafter. Moreover, the adhesive layers 2 may be full sheets or merely marginal strips around the perimeter films 3. The adhesive is operative to hold the image film 3 in place, as well as to keep grit or dirt from getting behind the film. These dirt particles could interfere with exposure or other aspects of the operation.

The registration device, per se, comprises the outer leaves 1 and 5. The top leaf 1 and the bottom leaf 5 may be substantially identical in configuration and are, generally, formed of the same type of material. Typically, the leaves are produced of a material which is capable of transmitting a suitable radiation therethrough. In most cases, the radiation is electromagnetic radiation such as a form of ultra-violet light. The portion of the spectrum of the light which is transmitted by the top and bottom leaves is a function of the type of materials used on the circuit panel. For example, the top and bottom leaves may be transmissive to ultraviolet light in the case of a circuit panel which uses dry film at 360 nanometers. Conversely, in a system where film-to-film techniques are used, the top and bottom leaves will typically be transmissive of visible light radiation.

As noted, the leaves 1 and 5 can be formed of any suitable type of material which is transmissive to the appropriate radiation. In the case where an ultraviolet light is transmitted therethrough, the leaves can be formed of a suitable acrylic material. Of course, other materials can be used such as glass or the like. However, glass tends to be very fragile and, therefore, limitative of the value of the invention. The preferred embodiment uses a relatively nonbreakable, plastic-type, material such as the acrylics noted above.

In addition, spacers 8 and 10 are shown on opposite edges of one surface of the bottom leaf 5. Of course, the spacers can be placed on the opposite edges of the surface of top leaf 1 without departing from the invention. Moreover, it is well within the purview of this invention to have one spacer affixed to the inner or upper surface of bottom leaf 5 and a separate spacer, for example, spacer 10, affixed to the inner or bottom surface of top leaf 1. In either event, the spacers 8 and 10 are affixed to the leaves 1 and/or 5 so as to provide a space between the leaves when they are placed in abutment, as discussed hereinafter, whereby the image film in the circuit panel can be properly placed. However, the main purpose of the spacers is to allow even vacuum draw-down of the elements within the frame.

The spacers 8 and 10 can be affixed to the respective leaves in any appropriate and desirable form and manner. For example, it is conceivable that one of the leaves can be appropriately rabbetted or etched or the like in order to define the spacers at the outer edges thereof.

In another instance, the spacers can be made of separate pieces of material. For example, the spacers can be made of another acrylic, a metal, or the like. Inasmuch as the spacers are generally displaced from the imaging area, the color, density, transparency and so forth are of little or no consequence.

In the case where the spacer is made of acrylic or of similar material, it may be affixed to the leaf with a permanent setting adhesive such as an epoxy or the like. In the case where the strips are made of metal, they may be fastened to the leaf with rivets or other suitable materials or fasteners. The specific details of the affixation of the spacers to the respective leaves is primarily a matter of design and convenience. However, it must be understood that the fastening means must be taken into consideration when the dimensions of the various parts are considered.

In addition, as shown in FIGS. 1, 2 and 3, at least one groove 11 is disposed in the outer surface of each of the top and bottom leaves 1 and 5. The grooves 9 are relatively small in dimensions although they extend the entire length of the respective leaves. As best seen in FIGS. 2 and 3, the process of placing the grooves in the surface of the leaves causes a slight ridge A to rise on each side of groove 11.

The purpose of the grooves 11 is to permit advantageous operation of the inventive registration device 100 with existing manufacturing equipment to be used in forming circuit boards and the like. That is, the manufacturing equipment is, generally, operated under vacuum to assure the film-to-work-product contact is securely achieved. This, generally, requires that all pockets of air must be evacuated from around and within the product being exposed. The more quickly the evacuation can be achieved, the shorter the draw-down time and exposure time cycle is.

The grooves 11 in the exterior surface of the top and bottom leaves have been found to permit the air to be pulled from the operating chamber in a fraction of the time otherwise required. That is, appropriate channels are provided to permit the ambient air to be removed from around the registration device 100 in an orderly, convenient and, therefore, expeditious manner. In addition, the ridges 11A which are produced on either side of the grooves 11 are found to extend the life of the registration device by reducing the amount of direct contact between the surface of the device 100 and the working surfaces of the table tops and exposure chambers. Thus, the efficiency of the operating device is further increased.

In addition, one or more registration pins 7 is affixed to at least one of the top or bottom leaves. In the embodiment shown in FIG. 1, a registration pin 7 is mounted in bottom leaf 5. The registration pins 7 are arranged to mate with appropriate registration or alignment holes 1A in top leaf 1 as well as any other registration holes such as 3A, 4A and the like in the panel 4 or image films 3 or the like. A detailed description and discussion of the registration pins is presented relative to FIGS. 12 through 15.

In addition, a plurality of zero-tolerance snap connectors 9 and 6 are provided in the registration device 100. Typically, one set of connectors is disposed in each of three corners of the registration device. This arrangement permits accurate registration but ready separation when desired. It is noted that the connector 9 is the male portion of the connector while the connector 6 is the female portion. In particular, the connectors 9 and 6 are disposed in the corners of the device and, typically, arranged to be located at the spacer portion. In the preferred embodiment, all of the male connector portions 9 are disposed in one panel while all of the female connector portions 6 are disposed in the other leaf. The snap connector is discussed and described in more detail relative to FIGS. 2 through 11.

The adhesive layer 2, as shown in FIG. 1, is used to affix the respective imaging films 3 to the top and bottom leaves 1 and 5, respectively. Typical methods of affixation which have been tested and found to work satisfactorily are use of a nonsetting adhesive which is transferred from its carrier to the respective leaf of the registration device 100. The image film 3 is then pressed against the adhesive 2 and stuck thereto. Because the adhesive is nonsetting, both the film and the adhesive can be removed readily and the basic registration device reused.

Another embodiment uses a setting type of adhesive, typically of a clear liquid formulation, which is applied to both the leaf and the film. However, because the adhesive sets up, the adherence is substantially permanent which essentially prevents the registration device from being reused.

Another affixing method is to utilize film holding pins (not shown) which are secured in both the top and the bottom leaves 1 and 5, respectively. This method of affixation requires the use of a film punching system which coordinates exactly with the preset pins in the registration device.

The registration pins 7 may be utilized in conjunction with a nonsetting adhesive to provide double assurance that the top and bottom films retain the most precise registration with the leaves 1 and 5 and the panel 4.

Referring now to FIGS. 12 through 15, the registration pin 7 of FIG. 1 is shown in greater detail. The registration pins perform the function of aligning the pre-sensitised panel 4 with the imaging films 3 which are attached to the leaves 1 and 5, respectively, by means of the suitable adhesive or fastening apparatus noted above. The registration pin 7 has a round or cylindrical base portion 70 which is machined or otherwise shaped to have four flat upper surfaces 71. The flat surfaces are connected together by an arcuate portions 72 which are continuations of the cylindrical configuration 71. (However, different diametric dimensions can be used for the upper and lower portions of the pin.) The bottom or base 73 is a relatively flat base member which is mounted to one leaf of the registration device 100. The head 74 of the registration pin 7 is essentially conically configured with a forty-five degree angle. The forty-five degree angle is not critical, per se, but is a preferred parameter.

The length of the registration pin is appropriate so that it is able to penetrate the various films, the coated panel and mate with an aligned hole in the top leaf as previously described.

The configuration of registration pin 7 is highly advantageous. That is, the conical head 74 (or point) splits the photosensitive coating which covers the alignment holes on the panel 4. The coating is split into wedge or pie-shaped sections. The flat sides of the pins permit the wedges of the coating to remain in the alignment holes as the circuit panel 4 slides onto the pin 7 in perfect alignment with the imaging films 3. This permits the segments of the coating to be attached to the panel during the exposure and development processes.

Moreover, the flat surfaces 71 on the pin 7 assure quick and easy entry of the pins into the panel while the full diameter portion 70 of the pin assures positive alignment of the device. Conversely, the flat portions 71 of the pin permit the panel to be easily released after the processing is complete.

The round base portion 73 of the pin is mounted in a counter bored portion of leaf 5. The barrel portion 70 is configured for a press fit in a hole in leaf 5. The length of barrel 70 is related to leaf 5 thickness, as shown.

Referring now to FIGS. 2 through 11, there are shown detailed illustrations of the zero-tolerance snaps 6 and 9 which are used with the instant invention. These snaps are used to provide exact alignment of all components involved within the registration device within its suitable and allowable tolerances. These snaps also provide exact, reliable, positioning of the desired registration device 100 over a prescribed tool life. In addition, the snaps are relatively easy to operate and, therefore, increase both productivity and efficiency of the registration device and the related processes.

The snap includes the receiver portion 6 (FIGS. 7 through 9) and the insert portion 9 (FIGS. 4 through 6 and 11) both of which portions may be machined or otherwise fabricated. The insert 9 is a basically cylindrical member having slots 9A across the upper end thereof to permit the upper end to be selectively flexible. The upper end also includes a lip 9D which protrudes therefrom. The barrel portion 9B is essentially annular with a shoulder 9C on the outer surface thereof which is slightly larger in diameter than the diameter of the receiver portion 6. Also, the barrel 9B is threaded for insertion and retention in the leaf. The shoulder 9C is mounted in a counter bore in the spacer.

The receiver portion 6 may also be molded, machined or otherwise fabricated. The receiver is a basically cylindrical member which is hollow so as to receive insert 9. Receiver 6 includes a shoulder 6A which abuts against the surface of a counter-bore in the leaf when mounted therein. The interior of receiver 6 also includes a lip or crown 6B which protrudes into the central aperture through the receiver.

Referring now to FIG. 10, there is shown a cross-sectional view of an engaged snap with portions of the related leaves. Thus, insert 9 is engaged within receiver 6. Inasmuch as the insert 9 is slightly flexible at the outer end thereof, it can be inserted into the receiver portion 6 by deflecting end 9D until the end thereof passes the lip 6B, whereupon the end of the insert expands and the lip 6B around the receiver 6 engages the shoulder 9D and provides a firm mating therebetween. It is noted that the shoulder 9D and lip 6B are both mutually champfered in order to establish a better abutment fit.

FIG. 11 shows another embodiment of the insertion portion of the connector. This portion 9' is similar to portion 9A' of FIGS. 4–6 except that shoulder 9C is omitted and the barrel 9B' is smaller in relative diameter than barrel portion 9B.

The snaps are preferably made of Delrin which is a high wear coefficient material which has elastic memory. Typically, the predicted lifetime of the snaps is greater than the lifetime of the imaging film or bottom leaf.

Thus, there is shown and described a new and unique registration device especially useful in imaging, lithographic, graphic or other types of similar processes. The device includes a pair of outer leaves which are used to enclose an imaging structure. The leaves typically have grooves which will enhance pressure control techniques. The device includes an improved registration pin which permits the device to have easy and ready registration. In addition, the device uses snap connectors which are of long life capability and which permit a firm connection with a very close tolerance alignment.

In the preferred embodiment, various parameters and materials are suggested or described. However, it is understood that any other suitable materials or reasonably similar parameters can be utilized in forming the invention. Those skilled in the art will recognize that modifications which fall within the purview of the instant invention and description are intended to be included therein as well. The illustrative embodiments are illustrative only and are not intended to be limitative. The scope of the invention is limited only by the claims appended hereto.

Having thus described a preferred embodiment of the instant invention, what is claimed is:

1. A registration device comprising,
   a pair of planar members having relatively large surface area,
   said planar members fabricated of a material which is selected to be substantially transparent to a specified radiation,
   connector means mounted at two or more corners of said pair of planar members to permit said planar members be selectively connected and disconnected, and
   registration means mounted at at least one of said planar members for establishing registration of said pair of planar members and materials held therebetween.
2. The device recited in claim 1 wherein,
   said planar members have lengthwise grooves scored in the outer surfaces thereof.
3. The device recited in claim 1 including, spacer means disposed on at least one of said planar members so that the planar members remain spaced apart even when connected by said connector means.

4. The device recited in claim 1 wherein,
said registration means comprises a pin mounted on one of said planar members and communicating with an aperture in the other planar member.

5. The device recited in claim 2 wherein,
said grooves have shoulders at the sides thereof.

6. The registration device recited in claim 1 wherein,
said registration means includes a pin comprising,
a first body portion which is cylindrical in configuration,
a second body portion which has one or more flat sides and extends from said first body portion, and
a pointed end thereof adjacent said second body portion.

7. The registration pin recited in claim 6 wherein,
said flat sides of said second body portion are joined by arcuate side portions extended from said first body portion.

8. The registration device recited in claim 6 wherein,
said pointed end comprises a conical point of about 45°.

9. A registration device comprising,
pair of planar members each having a relatively large surface area,
at least one of said pair of planar members fabricated of a material which is substantially transparent to a specified radiation,
at least one of said pair of planar members having lengthwise grooves provided at the outer surface thereof,
connector means provided at least two corners of each of said pair of planar members to permit said pair of planar members to be selectively and readily connected and disconnected, and
registration means mounted at least one of said pair planar members for establishing registration of said pair of planar members and materials therebetween.

* * * * *